(12) United States Patent
Cornejo et al.

(10) Patent No.: US 8,584,354 B2
(45) Date of Patent: Nov. 19, 2013

(54) METHOD FOR MAKING GLASS INTERPOSER PANELS

(75) Inventors: Ivan A Cornejo, Corning, NY (US); Sinue Gomez, Corning, NY (US); James Micheal Harris, Elmira, NY (US); Lisa Anne Moore, Corning, NY (US); Sergio Tsuda, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 287 days.

(21) Appl. No.: 12/868,976

(22) Filed: Aug. 26, 2010

(65) Prior Publication Data

US 2012/0048604 A1    Mar. 1, 2012

(51) Int. Cl.
    *H05K 3/10*    (2006.01)
(52) U.S. Cl.
    USPC .................. 29/852; 29/825; 29/846; 427/97.2
(58) Field of Classification Search
    USPC ............................ 29/825, 846, 852; 427/97.2
    See application file for complete search history.

(56) References Cited

U.S. PATENT DOCUMENTS

| | | | |
|---|---|---|---|
| 3,843,472 A | 10/1974 | Toussaint et al. ............ 161/199 |
| 6,858,892 B2 | 2/2005 | Yamagata |
| 6,984,792 B2 | 1/2006 | Brofman et al. |
| 6,990,285 B2 | 1/2006 | Schroeder et al. |
| 7,170,167 B2 | 1/2007 | Hsuan et al. |
| 7,211,899 B2 | 5/2007 | Taniguchi et al. |
| 7,220,667 B2 | 5/2007 | Yamagata |
| 7,294,559 B2 | 11/2007 | Hsu |
| 7,417,867 B1 | 8/2008 | Matsuda et al. |
| 7,678,695 B2 | 3/2010 | Taniguchi et al. |
| 7,863,106 B2 * | 1/2011 | Christo et al. ............... 438/119 |
| 2003/0193093 A1 | 10/2003 | Brofman et al. |
| 2004/0033654 A1 | 2/2004 | Yamagata |
| 2005/0093095 A1 | 5/2005 | Yamagata |
| 2008/0073110 A1 | 3/2008 | Shioga et al. |
| 2010/0155888 A1 * | 6/2010 | Christo et al. ............... 257/532 |

FOREIGN PATENT DOCUMENTS

JP    2003-20257    1/2003

OTHER PUBLICATIONS

J.R Varner et al; "Surface Defects: Their Origin, Characterization and Effects on Strength"; Journal of Non-Crystalline Solids 19 (1975) 321-333.
Vijay Sukumaran et al; "Through-Package-Via Formation and Metallization of Glass Interposers"; 2010 Electronic Components and Technology Conference 557-563.
Stefan Karlsson et al; "The Technology of Chemical Glass Strengthening—A Review"; Glass Technology: Europe/ Glass Science Technology A, Apr. 2010, 51 (2), 41-54.

* cited by examiner

*Primary Examiner* — Carl Arbes
(74) *Attorney, Agent, or Firm* — Joseph M. Homa; Gregory V. Bean

(57) ABSTRACT

Glass interposer panels and methods for forming the same are described herein. The interposer panels include a glass substrate core formed from an ion-exchangeable glass. A first layer of compressive stress may extend from a first surface of the glass substrate into the thickness T of the glass substrate core to a first depth of layer $D_1$. A second layer of compressive stress may be spaced apart from the first layer of compressive stress and extending from a second surface of the glass substrate core into the thickness T of the glass substrate core to a second depth of layer $D_2$. A plurality of through-vias may extend through the thickness T of the glass substrate core. Each through-via is surrounded by an intermediate zone of compressive stress that extends from the first layer of compressive stress to the second layer of compressive stress adjacent to a sidewall of each through-via.

12 Claims, 7 Drawing Sheets

METHOD FOR MAKING GLASS INTERPOSER PANELS

BACKGROUND

1. Field

The present specification generally relates to interposer panels for electronic package assemblies and, more specifically, to glass interposer panels for electronic assemblies formed from strengthened glass.

2. Technical Background

A current trend in the miniaturization of electronic devices is the 3D integration of electronic components, such as 3D integrated circuits, on a single substrate such that the electronic components are stacked thereby forming a more compact package. A driving force for this trend is consumer demand for mobile and handheld electronic devices and higher density I/Os as chips become increasingly complex.

Currently, organic interposer panels are commonly integrated into 3D electronic assemblies due to their low cost and ease of manufacture. However, organic interposer panels exhibit poor dimensional stability and high thermal mismatch with common integrated circuit materials, such as silicon, which, in turn, limits the input/output density and the achievable miniaturization of the electronic assembly. Further, organic interposer panels exhibit poor thermal conductivity which also limits the achievable power density of the electronic assembly.

Alternatives to organic interposer panels include silicon interposer panels. Silicon interposer panels exhibit improved thermal and dimensional characteristics relative to organic interposer panels. However, silicon interposer panels are relatively expensive to produce and are limited in size.

Accordingly, a need exists for alternative interposer panels with improved strength, durability and suitable thermal characteristics.

SUMMARY

According to one embodiment, an interposer panel for an electronic assembly includes a glass substrate core formed from an ion-exchangeable glass. The glass substrate core includes a first surface, a second surface opposite the first surface, and a thickness T. A first layer of compressive stress may extend from the first surface of the glass substrate core into the thickness T of the glass substrate core to a first depth of layer $D_1$. A second layer of compressive stress may be spaced apart from the first layer of compressive stress and extending from the second surface of the glass substrate core into the thickness T of the glass substrate core to a second depth of layer $D_2$. A plurality of through-vias may extend through the thickness T of the glass substrate core. Each through-via of the plurality of through-vias is surrounded by an intermediate zone of compressive stress that extends from the first layer of compressive stress to the second layer of compressive stress adjacent to a sidewall of each through-via.

In another embodiment, a method for making an interposer panel for an electronic assembly includes forming a plurality of through-vias in a glass substrate core. Thereafter, a first layer of compressive stress, a second layer of compressive stress, and a plurality of intermediate zones of compressive stress may be induced in the glass substrate core. The first layer of compressive stress may extend from a first surface of the glass substrate core into a thickness T of the glass substrate core to a first depth of layer $D_1$. The second layer of compressive stress may extend from a second surface of the glass substrate core into the thickness T of the glass substrate core to a second depth of layer $D_2$. The first layer of compressive stress is spaced apart from the second layer of compressive stress. A sidewall of each through-via of the plurality of through-vias is surrounded by one of the plurality of intermediate zones of compressive stress. Each intermediate zone of compressive stress of the plurality of intermediate zones of compressive stress extends from the first layer of compressive stress to the second layer of compressive stress adjacent the sidewall of each through-via.

In yet another embodiment, a method for making an interposer panel for an electronic assembly, includes forming a plurality of through-vias in a glass substrate core comprising ion-exchangeable glass. Thereafter, the glass substrate core is etched to remove flaws from the glass substrate core such that a strength of the glass substrate core is greater than before etching. The glass substrate core may then be strengthened by ion exchange to form a first layer of compressive stress extending from a first surface of the glass substrate core into a thickness T of the glass substrate core. The first layer of compressive stress may have a first depth of layer $D_1$. A second layer of compressive stress may extend from a second surface of the glass substrate core into a thickness T of the glass substrate core. The second layer of compressive stress has a second depth of layer $D_2$ and is spaced apart from the first layer of compressive stress. The plurality of intermediate zones of compressive stress may generally correspond to the plurality of through-vias such that each through-via of the plurality of through-vias is surrounded by a corresponding one of the plurality of intermediate zones of compressive stress.

Additional features and advantages of the invention will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
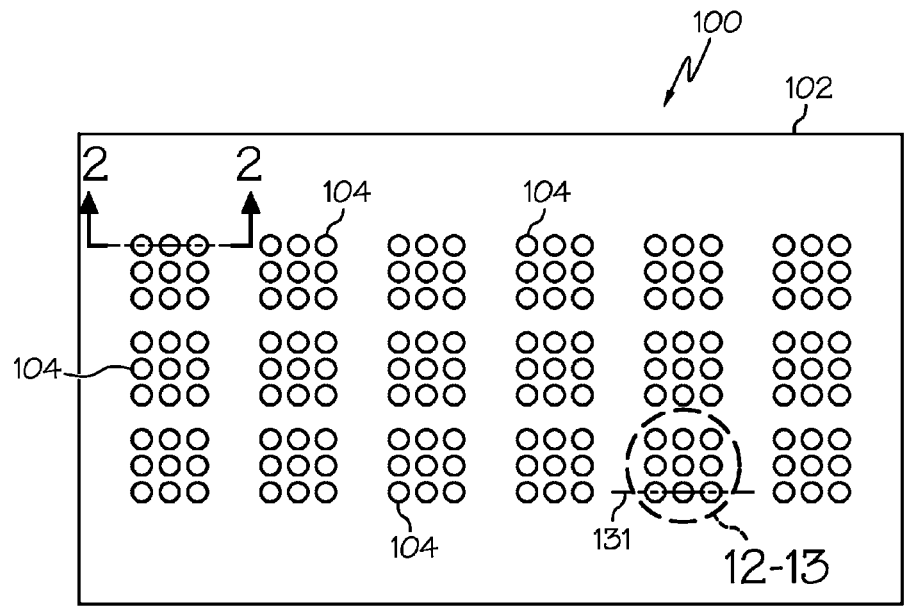
FIG. 1 schematically depicts a glass interposer panel according to one or more embodiments shown and described herein.

Reference will now be made in detail to various embodiments of glass interposer panels and methods of making the same, examples of which are illustrated in the accompanying drawings. One embodiment of a glass interposer panel is schematically depicted in FIG. 1. The glass interposer panel generally comprises a glass substrate core formed from an ion-exchangeable glass. A plurality of through-vias extend through the thickness of the glass substrate core. A first layer of compressive stress extends from the first surface of the glass substrate core to a depth of layer $D_1$. A second layer of compressive stress extends from the second surface of the glass substrate core to a depth of layer $D_2$. Each through-via of the plurality of through-vias is surrounded by an intermediate zone of compressive stress that extends from the first layer of compressive stress to the second layer of compressive stress adjacent to the sidewall of each through-via. Glass interposer panels and methods for forming glass interposer panels will be described in more detail herein with reference to the appended figures.

Referring now to FIG. 1, a glass interposer panel 100 is schematically depicted according to one or more embodiments shown and described herein. The glass interposer panel 100 generally comprises a glass substrate core 102 in which a plurality of through-vias 104 are formed. In the embodiments described herein, the glass substrate core 102 is formed from a glass composition which may be chemically strengthened, such as by ion exchange processing. For example, the glass substrate core 102 may be formed from soda-lime glass batch compositions, alkali aluminosilicate glass batch compositions, alkali aluminoborosilicate glass batch compositions or other glass batch compositions which may be strengthened by ion exchange after formation. In one particular example, the glass substrate core 102 is formed from Gorilla™ glass produced by Corning, Inc.

In one embodiment, the glass substrate core is formed from a glass composition which has a high coefficient of thermal expansion (CTE). For example, the CTE of the glass substrate core may be similar to the CTEs of circuit materials which may be applied to the glass substrate core, including, without limitation, semiconductor materials, metallic materials and the like. In one embodiment the CTE of the glass substrate core may be from about $45 \times 10^{-7}/°$ C. to about $100 \times 10^{-7}/°$ C. However, it should be understood that, in other embodiments, the CTE of the glass substrate core may be less than about $45 \times 10^{-7}/°$ C.

The glass substrate core 102 is generally planar with a first surface 106 and a second surface 108 positioned opposite to and planar with the first surface. The glass substrate core 102 generally has a thickness T (FIG. 2) extending between the first surface 106 and the second surface 108. In the embodiments described herein the thickness T of the glass substrate core 102 is from about 50 microns to about 1 mm. For example, in one embodiment, the glass substrate core 102 has a thickness from about 100 microns to about 150 microns. In another embodiment, the glass substrate core 102 has as thickness from about 150 microns to about 500 microns. In yet another embodiment, the glass substrate core 102 has a thickness from about 300 microns to about 700 microns.

The glass substrate core 102 is initially provided in as-drawn condition (i.e., prior to strengthening by ion exchange) before the through-vias 104 are formed through the thickness T of the glass substrate core 102. Thereafter, the through-vias 104 are formed in the un-strengthened glass substrate core 102 to create the glass interposer panel 100. Forming the through-vias 104 in the un-strengthened glass substrate core 102, as described herein, reduces cracking or chipping of the glass substrate core, particularly in areas adjacent to the through-vias 104 where the glass substrate core 102 is susceptible to damage during machining after ion-exchange strengthening.

In one embodiment, the glass substrate core 102 may be annealed prior to forming the through-vias 104. Annealing the glass substrate core 102 reduces or eliminates residual stresses present in the glass substrate core 102 which may lead to cracking or chipping of the glass substrate core during formation of the through-vias when the residual stresses are present in the glass substrate core during formation of the through-vias 104. In embodiments where the glass substrate core 102 is annealed, the annealing process may comprise heating the glass substrate core to the annealing point of the glass (i.e., to a temperature where the dynamic viscosity of the glass is about $1 \times 10^{13}$ Poise). However, it should be understood that the annealing step is optional and that, in some embodiments, through-vias may be formed in the glass substrate core without first undergoing an annealing step.

The through-vias 104 may be formed in the un-strengthened glass substrate core 102 using any one of a variety of forming techniques. For example, the through-vias 104 may be formed by mechanical drilling, etching, laser ablation, laser assisted processes, abrasive blasting, abrasive water jet machining, focused electro-thermal energy or any other suitable forming technique. In one particular embodiment the through-vias 104 are formed using a laser ablation technique as described in U.S. Pat. No. 6,990,285 entitled "Method of making at least one hole in a transparent body and devices made by this method" and assigned to Corning, Inc., the entirety of which is herein incorporated by reference.

Figure 2:
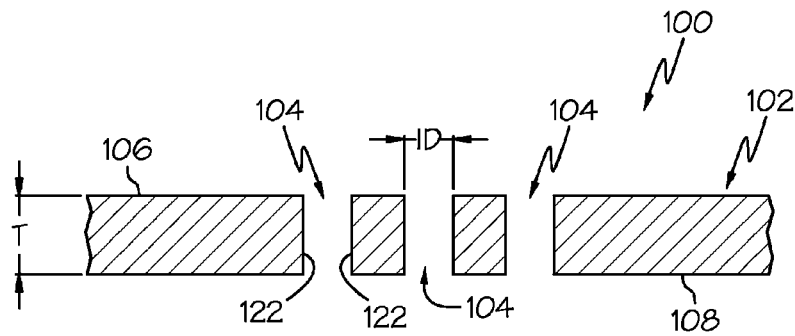
FIG. 2 schematically depicts a cross section of a glass interposer panel illustrating one configuration of the through-vias according to one or more embodiments shown and described herein.

Referring now to FIGS. 1 and 2, in one embodiment, the through-vias 104 have a substantially circular cross section in the plane of the glass substrate core 102 and a diameter ID in the range from about 10 microns to about 1 mm. In the embodiment shown in FIG. 2, the through-vias 104 have a substantially cylindrical sidewall 122 such that the diameter ID of each through-via 104 is the same at the first surface 106 of the glass substrate core 102 and the second surface 108 of the glass substrate core 102. In the embodiment shown in FIG. 2, each through-via 104 has approximately the same diameter ID. However, in other embodiments (not shown), the through-vias may be formed with different diameters. For example, a first plurality of through-vias may be formed with a first diameter, while a second plurality of through-vias may be formed with a second diameter.

Figure 3:
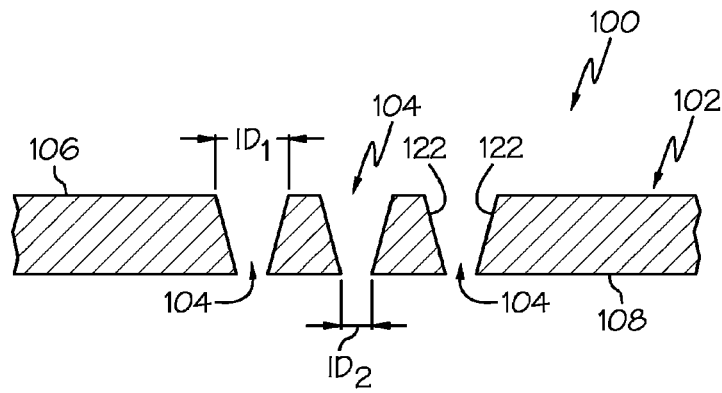
FIG. 3 schematically depicts a cross section of a glass interposer panel illustrating another configuration of the through-vias according to one or more embodiments shown and described herein.

Referring now to FIGS. 1 and 3, in another embodiment, the through-vias 104 may be formed such that the through-vias 104 are substantially conical, as depicted in FIG. 3. For example, the through-vias 104 may be formed such that the sidewall 122 of the through-via 104 tapers between the first surface 106 of the glass substrate core 102 and the second surface 108 of the glass substrate core 102. In this embodiment, the through-vias 104 may have a first diameter $ID_1$ at the first surface 106 of the glass substrate core 102 and a second, different diameter $ID_2$ at the second surface of the glass substrate core 102.

In yet another embodiment (not shown), the through-vias 104 may be formed such that the sidewalls of the through-vias taper from the first surface of the glass substrate core to a mid-plane of the glass substrate core (i.e., a plane through the glass substrate core between the first surface of the glass substrate core and a second surface of the glass substrate core) and expand from a mid-plane of the glass substrate core to the second surface of the glass substrate core (i.e., the through-vias have the general shape of an hour glass through the thickness T of the glass substrate core 102). In this embodiment, the through-vias 104 may have first diameter at the first surface of the glass substrate core, a second diameter at the second surface of the glass substrate core, and a third diameter at a mid-plane of the glass substrate core such that the first diameter and the second diameter are greater than the third diameter. In one embodiment, the first diameter and the second diameter may be equal.

While specific reference has been made herein to through-vias with different cross-sectional geometries through the thickness of the glass substrate core, it should be understood that the through-vias may take on a variety of other cross-sectional geometries and, as such, the embodiments described herein are not limited to any particular cross-sectional geometry of the through-vias.

While FIGS. 2 and 3 depict embodiments of through-vias with substantially cylindrical sidewalls and embodiments of through-vias with substantially conical sidewalls, it should be understood that both types of through-vias may be formed in a single glass interposer panel 100. Further, in the embodiment of the glass interposer panel 100 depicted in FIG. 1, the through-vias 104 are formed in the un-strengthened glass substrate core in a regular pattern. However, it should be understood that, in other embodiments, the through-vias 104 may be formed in a non-regular pattern.

Moreover, while the through-vias 104 are depicted as having a circular cross section in the plane of the glass substrate core 102 in the embodiment of the glass interposer panel 100 depicted in FIG. 1, it should be understood that the through-vias may have other planar cross-sectional geometries. For example, the through-vias may have various other cross sectional geometries in the plane of the glass substrate core, including, without limitation, elliptical cross sections, square cross sections, rectangular cross sections, triangular cross sections, and the like. Further, it should be understood that through-vias 104 with different cross sectional geometries may be formed in a single interposer panel.

In the embodiments of the glass interposer panel 100 shown and described herein, the glass interposer panel 100 is formed with a plurality of through-vias 104. However, in other embodiments (not shown), the glass interposer panel 100 may also include one or more blind-vias, such as when a via does not extend through the thickness T of the glass substrate core 102. In these embodiments, the blind-vias may be formed using the same techniques as the through-vias and may have similar dimensions and planar cross-sectional geometries as the through-vias.

In one embodiment, the glass interposer panel 100 may be annealed after formation of the through-vias 104. In this embodiment, the annealing step may be utilized to reduce stresses that develop in the glass interposer panel 100 during formation of the through-vias 104. For example, where laser-assisted processing is used to form the through-vias 104, thermal stresses may remain in the glass substrate core after formation of the through-vias. The annealing step may be utilized to relieve these residual stresses such that the glass interposer panel 100 is substantially stress-free. However, it should be understood that an annealing step performed after formation of the through-vias is optional and that, in some embodiments, the glass interposer panel 100 is not annealed after formation of the through-vias.

In another embodiment, the glass substrate core 102 may be chemically etched after formation of the through-vias. For example, the glass substrate core may be chemically etched by submerging the glass substrate core in an acid solution which removes defects from the surface of the glass substrate core and from the interior of the through-vias. Removing these defects by etching reduces the number of crack initiation locations in the interposer panel and, as a result, improves the strength of the glass interposer panel. In one embodiment, where the glass interposer panel is formed from Gorilla™ glass, the glass interposer panel may be chemically etched in a solution of $HF:HCl:20H_2O$ for 15 minutes to remove defects from the surface of the glass interposer panels and from the through-vias. However, it should be understood that the chemical etching step after formation of the through-vias is optional and that, in some embodiments, the glass interposer panel is not chemically etched after formation of the through-vias.

After the through-vias 104 have been formed in the glass substrate core 102, the glass interposer panel is chemically strengthened with an ion exchange process in which smaller metal ions in the glass are replaced or "exchanged" with larger metal ions of the same valence within a layer of the glass that is close to the outer surface of the glass. The replacement of smaller ions with larger ions creates a compressive stress within the surface of the glass which extends to a depth of layer (DOL). In one embodiment, the metal ions are monovalent alkali metal ions (e.g., $Na^+$, $K^+$, $Rb^+$, and the like), and ion exchange is accomplished by immersing the substrate in a bath comprising at least one molten salt (e.g., $KNO_3$, $K_2SO_4$, $KCl$, or the like) of the larger metal ion that is to replace the smaller metal ion in the glass. Alternatively, other monovalent cations such as $Ag^+$, $Tl^+$, $Cu^+$, and the like can be exchanged for the alkali metal cations in the glass. The ion exchange process or processes that are used to strengthen the glass interposer panels can include, but are not limited to, immersion of the glass in a single bath or immersion of the glass in multiple baths of like or different compositions with washing and/or annealing steps between immersions.

By way of example, in the embodiments described herein where the glass interposer panel 100 is formed from a glass substrate core 102 comprising Gorilla™ glass, the glass interposer panel may be ion exchange strengthened by immersing the glass substrate core in a $KNO_3$ molten salt bath having a temperature of 410° C. When the glass substrate core is immersed in the salt bath, $Na^+$ ions in the un-strengthened glass substrate core are exchanged with $K^-$ ions thereby introducing compressive stress in the glass substrate core. The magnitude and the depth of layer (DOL) of the compressive stress introduced in the glass substrate core 102 generally depends on the length of time the glass substrate core is immersed in the salt bath. For example, immersing a glass substrate core formed from 0.7 mm thick Gorilla™ glass in a $KNO_3$ salt bath at a temperature of 410° C. for 7 hours produces a compressive stress of approximately 720 MPa and a depth of layer of 50 microns.

While reference has been made herein to a specific ion exchange strengthening process used in conjunction with a specific glass composition, it should be understood that other ion exchange processes may also be used. Moreover, it should be understood that the ion exchange process utilized to strengthen the glass interposer panel may vary depending on the specific composition of the glass substrate core from which the glass interposer panel is formed.

Figure 4:
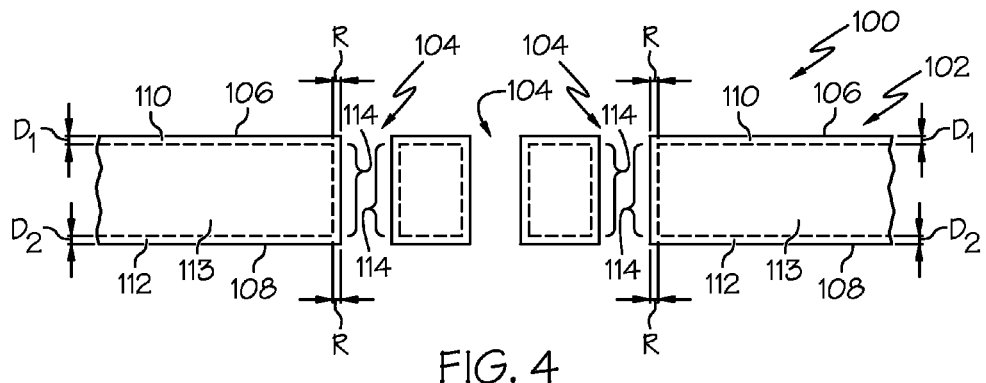
FIG. 4 schematically depicts a cross section of a glass interposer panel illustrating the depth of layer of compressive stress introduced in the glass interposer panel according to one or more embodiments shown and described herein.

Referring now to FIG. 4, chemically strengthening the glass interposer panel 100 induces a first layer 110 of compressive stress which extends from the first surface 106 of the glass substrate core 102 into the thickness of the glass substrate core to a depth of layer $D_1$. Similarly, chemically strengthening the glass interposer panel 100 induces a second layer 112 of compressive stress which extends from the second surface 108 of the glass substrate core 102 into the thickness of the glass substrate core 102 to a depth of layer $D_2$. The first layer 110 of compressive stress and the second layer 112 of compressive stress are spaced apart from one another by a layer of central tension 113. In one embodiment described herein, the compressive stress may be from about 200 MPa to about 1000 MPa. In another embodiment, the compressive stress may be from about 500 MPa to about 800 MPa. In yet another embodiment, the compressive stress may be from about 650 MPa to about 900 MPa. In the embodiments described herein, the first depth of layer $D_1$ is substantially equal to the second depth of layer $D_2$. In one embodiment, the first and the second depth of layer may each be from about 5 microns to about 100 microns. In another embodiment, the first and the second depth of layer may each be from about 30 microns to about 60 microns. In yet another embodiment, the first and the second depth of layer may each be from about 40 microns to about 60 microns.

Further, chemically strengthening the glass interposer panel 100 after the through-vias 104 have been formed in the glass substrate core 102 creates a plurality of intermediate zones 114 of compressive stress which surround each of the through-vias 104 and extend from the sidewall 122 of the through-via 104 into the glass substrate core. For example, each intermediate zone 114 of compressive stress forms around and directly adjacent to the sidewall of a corresponding through-via 104 such that the through-via 104 is surrounded by a cylinder of compressive stress which extends from the first surface 106 of the glass substrate core 102 to the second surface 108 of the glass substrate core. In the embodiments described herein, each intermediate zone 114 of compressive stress extends from the first layer 110 of compressive stress to the second layer 112 of compressive stress such that a cylinder of glass surrounding the through-via is under compression through the thickness of the glass substrate core 102. Each intermediate zone 114 of compressive stress has a radial thickness R. In one embodiment described herein, the radial thickness R is substantially equal to the first depth of layer $D_1$ and the second depth of layer $D_2$. Accordingly, it should be understood that, in some embodiments, the intermediate zone 114 of compressive stress surrounding each through-via 104 may have a radial thickness from about 5 microns to about 100 microns, while in other embodiments the radial thickness may be from about 30 microns to about 60 microns. In still other embodiments the radial thickness R is from about 40 microns to about 60 microns. In the embodiments described herein, the compressive stress in each zone of compressive stress may be from about 200 MPa to about 1000 MPa. For example, in one embodiment, the compressive stress in each intermediate zone of compressive stress may be from about 500 MPa to about 800 MPa. In yet another embodiment, the compressive stress in each intermediate zone of compressive stress may be from about 650 MPa to about 900 MPa.

The intermediate zones 114 of compressive stress induced around each through-via 104 reduce the propensity of the glass interposer panel to fail from cracks which initiate from the sidewall of the through-vias 104. Accordingly, the intermediate zones 114 of compressive stress induced around the through-vias 104 improve the overall strength of the glass interposer panel 100. Moreover, the intermediate zones 114 of compressive stress induced around the through-vias may actually increase the strength of the glass interposer panel 100 to levels which exceed the strength of the glass substrate core prior to forming the through-vias, as will be described in more detail herein with reference to specific examples.

Figure 12:
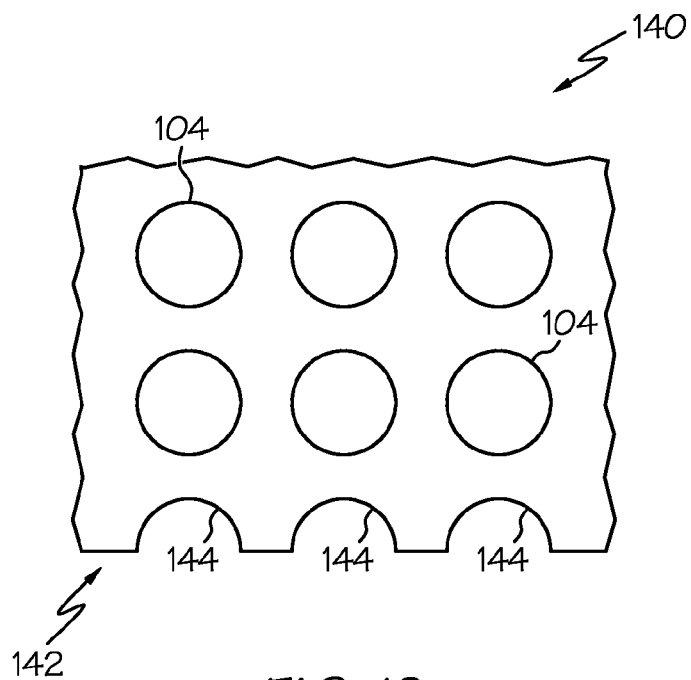
FIG. 12 schematically depicts a glass interposer panel with a scalloped edge according to one or more embodiments shown and described herein.
Figure 13:
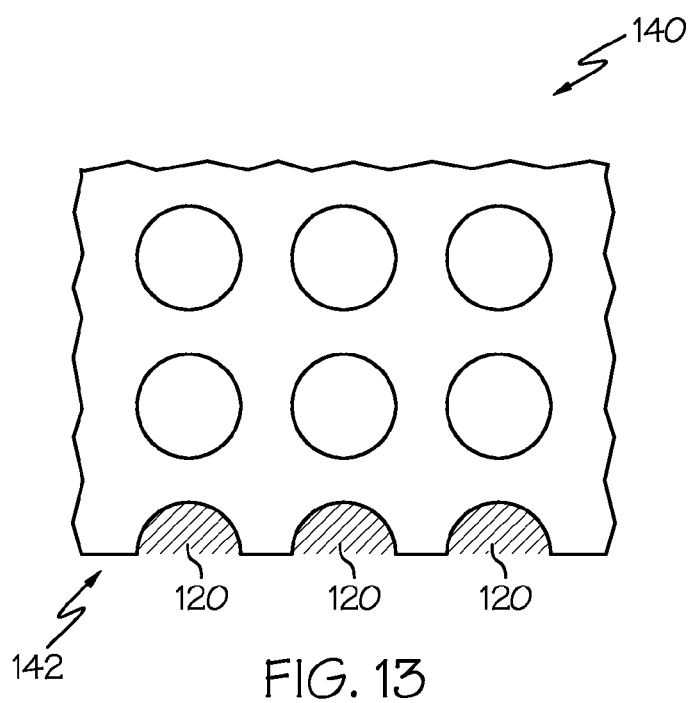
FIG. 13 schematically depicts a glass interposer panel with a metallized scalloped edge according to one or more embodiments shown and described herein.

Referring now to FIGS. 1 and 12-13, in some embodiments, after the through-vias 104 are formed and the glass interposer panel 100 is chemically strengthened, the glass interposer panel 100 may be separated into sub-panels before additional processing occurs. In one embodiment, the glass interposer panel 100 is separated along at least one parting line 131 which extends across a row of through-vias 104, as shown in FIG. 1. When the glass interposer panel 100 is separated using this technique, a sub-panel 140 (FIG. 12) may be produced which has at least one scalloped edge 142. The scalloped portions 144 of the scalloped edge 142 may have a compressive layer which extends through the thickness of the sub-panel 140 due to the ion exchange strengthening. Accordingly, the scalloped edge 142 may have additional edge strength and an improved resistance to fracture. In this embodiment, the scalloped portions 144 of the scalloped edge 142 may be filled with a filler material. For example, in the embodiment depicted in FIG. 13, the scalloped portions 144 may be metallized or filled with a conductive material, such as a metallic material 120, to provide a series of metal pads along the scalloped edge 142. The metal pads may be used as electrical connections to and from the sub-panel 140. Suitable materials for metallizing the scalloped portions 144 may include, without limitation, copper and copper alloys, gold and gold alloys, silver and silver alloys, platinum and platinum alloys or aluminum and aluminum alloys. In an alternative embodiment, the scalloped portions 144 may be filled with other filler materials including, without limitation, polymeric materials, frit materials and the like, to serve other functionalities, such as insulating the panel or providing protection to the edges of the panel.

Figure 5:
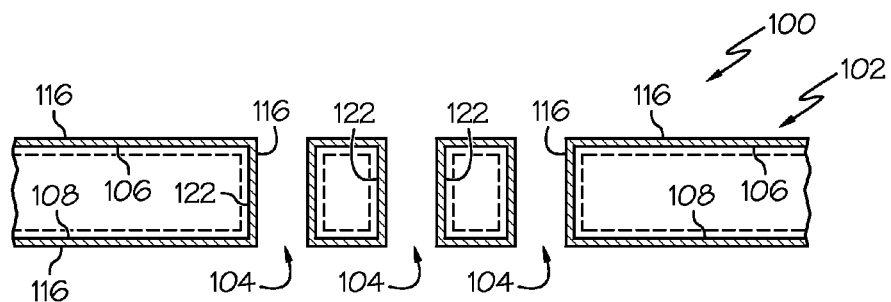
FIG. 5 schematically depicts a cross section of a glass interposer panel with a barrier layer according to one or more embodiments shown and described herein.

In other embodiments, after the through-vias 104 are formed and the glass interposer panel 100 is chemically strengthened, additional material layers and/or components may be added to the glass interposer panel 100 to prepare the glass interposer panel 100 for use in an electronic assembly. For example, referring to FIG. 5, a barrier layer 116 may be applied to the glass substrate core 102 after the glass interposer panel 100 has been strengthened by ion exchange. In the embodiments described herein, the barrier layer 116 is applied to the glass substrate core 102 such that the barrier layer 116 coats the first surface 106 of the glass substrate core 102, the second surface 108 of the glass substrate core 102, and the sidewalls 122 of the through-vias 104, as depicted in FIG. 5. In other embodiments (not shown), the barrier layer 116 may be applied to the first surface 106 and/or the second surface 108. The barrier layer 116 prevents the diffusion of alkali ions from the glass substrate core 102 into materials and/or components positioned on the glass substrate core 102. Accordingly, it should be understood that the barrier layer 116 may be formed from any composition suitable for preventing the diffusion of alkali ions from the glass substrate core 102. For example, in one embodiment, the barrier layer is formed from silicon nitride applied to the substrate to a thickness ranging from a few nanometers to a few microns. In another embodiment, the barrier layer may be formed from materials other than silicon nitride, including, without limitation silicon oxide, silicon dioxide, or silicon carbide.

Figure 6:
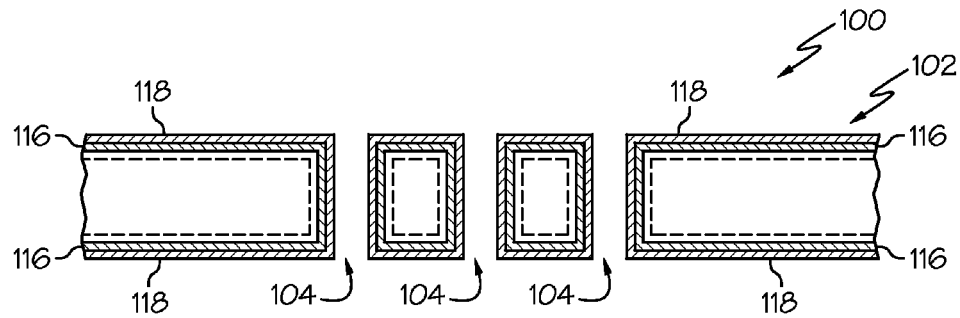
FIG. 6 schematically depicts a cross section of a glass interposer panel with a barrier layer and an adhesion layer according to one or more embodiments shown and described herein.

Referring now to FIG. 6, in another embodiment, an adhesion layer 118 is applied to the glass interposer panel 100 over the barrier layer 116. In the embodiments described herein, the adhesion layer 118 is applied to the glass interposer panel 100 such that the adhesion layer 118 is applied over the barrier layer 116. In the embodiments described herein, the adhesion layer 118 coats the first surface 106 of the glass substrate core 102, the second surface 108 of the glass substrate core 102, and the sidewalls of the through-vias 104, as depicted in FIG. 5. However, in other embodiments (not shown), the adhesion layer 118 may be applied to the sidewalls of the through-vias 104 and in a ring around the through-vias 104 on the first surface 106 and/or the second surface 108. The adhesion layer 118 is generally formed from a material that promotes the adhesion of additional materials subsequently applied to the glass interposer panel 100 including, without limitation, metals, dielectric materials, semiconductor materials, and the like. In the embodiments described herein the adhesion layer 118 may be formed from various materials including, without limitation, titanium, titanium alloys, chrome, chrome alloys, copper or copper alloys. For example, in one embodiment, the adhesion layer is formed from copper applied to the substrate to a thickness of less than a nanometer. For example, in one embodiment, the adhesion layer is has a thickness on the order of several atomic layer (i.e., a layer having a thickness of several atoms of the material of the adhesion layer. In another embodiment, the adhesion layer may be formed from other materials, including, without limitation, silanes. While the adhesion layer 118 is applied over the barrier layer 116, it should be understood that, in other embodiments, the adhesion layer 118 may be applied directly to the first surface of the glass substrate core, the second surface of the glass substrate core, the sidewall of each of the through-vias, or combinations thereof.

Figure 7:
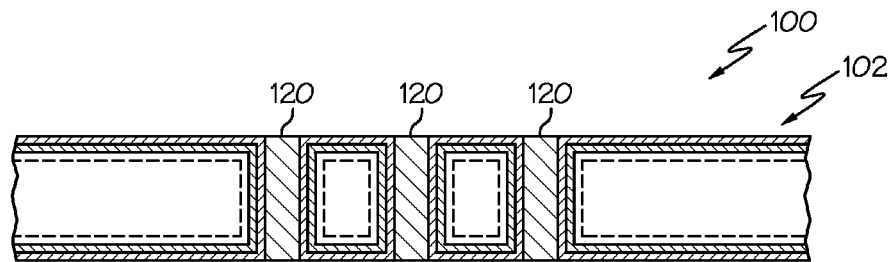
FIG. 7 schematically depicts a cross section of a glass interposer panel with a barrier layer, and adhesion layer, and metallized through-vias according to one or more embodiments shown and described herein.

Referring now to FIG. 7, after the adhesion layer 118 is applied to the glass interposer panel 100, the through-vias 104 may be metallized by filling the through-vias 104 with a conductive material 120 such as a conductive metallic material. For example, in one embodiment, the through-vias 104 may be metallized by depositing a conductive material, such as copper or a copper alloy, in the through-vias thereby providing a conductive pathway through the thickness of the glass interposer panel 100. Suitable materials for metallizing the through-vias may include, without limitation, copper and copper alloys, gold and gold alloys, silver and silver alloys, platinum and platinum alloys, or aluminum and aluminum alloys.

After the through-vias have been metallized, one or more dielectric layers (not shown) and/or electrical components (not shown), such as integrated circuit components, analog circuit components, semiconductor materials, or the like, may be positioned on the glass interposer panel 100 to form a three-dimensional electronic assembly.

Figure 8:
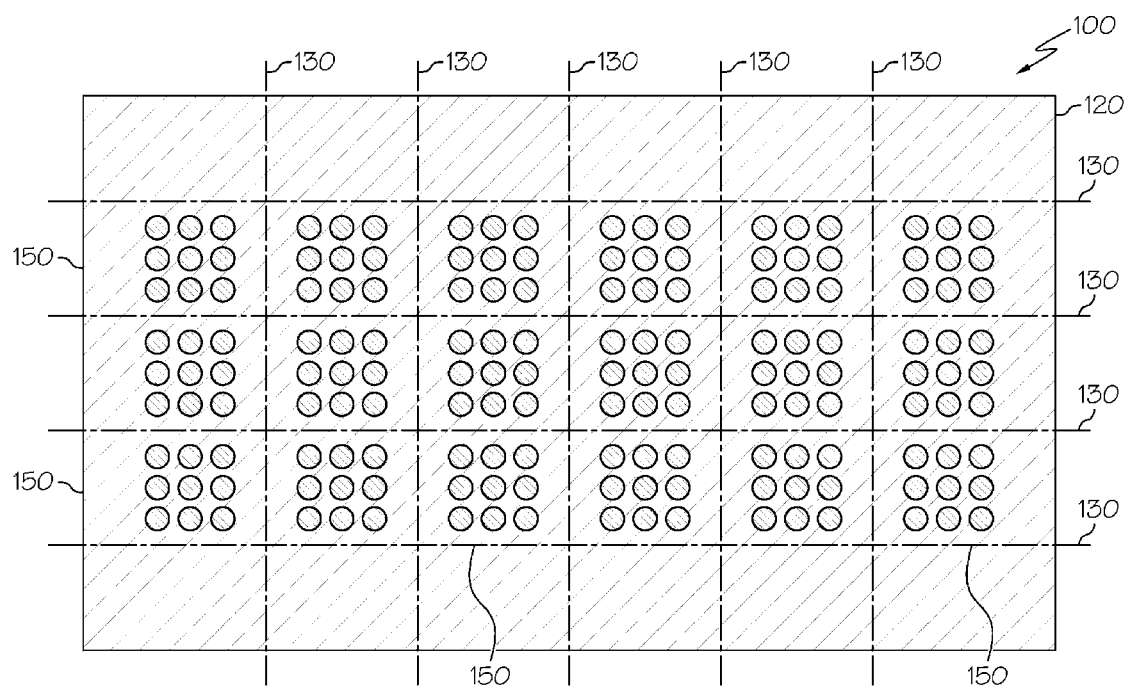
FIG. 8 schematically depicts a glass interposer panel with metallized through-vias according to one or more embodiments shown and described herein.

Referring to FIG. 8, in some embodiments, before dielectric layers and/or electrical components are added to the glass interposer panel 100, the glass interposer panel 100 may be separated into a plurality of smaller panels 150 along parting lines 130. Various separation techniques may be used to separate the glass interposer panel 100 along the parting lines 130 including, without limitation, laser score and break techniques, mechanical score and break techniques, laser through cutting and the like. In embodiments where the central tension in the glass interposer panel 100 is less than approximately 20 MPa, laser score and break techniques employing a $CO_2$ laser or even mechanical scribe and break techniques may be utilized to facilitate separation. However, in embodiments where the glass interposer panels have high levels of central tension, laser through cutting techniques may be employed to facilitate separation.

EXAMPLES

The embodiments described herein will be further clarified by the following examples.

In each of the following Examples the glass substrates and glass interposer panels were tested to failure using the ring-on-ring testing technique described in ASTM C1499-09: Standard Test Method for Monotonic Equibiaxial Flexural Strength of Advanced Ceramics at Ambient Temperature. Each set of samples consisted of 10 samples and the average failure stress for the set of 10 samples was determined by averaging the failure stress for each individual sample in the set.

In order to establish a baseline reference for each of the following examples, a 50 mm×50 mm×0.7 mm thick Gorilla™ glass substrate without through-vias and without ion exchange strengthening was mechanically tested to failure using ring-on-ring testing. The failure stress was determined to be approximately 450 MPa based on testing. In addition, a 50 mm×50 mm×0.7 mm thick Gorilla™ glass substrate without through-vias was ion exchange strengthened in molten $KNO_3$ at 410° C. for 7 hours to produce a compressive stress of 720 MPa extending to a depth of layer of 50 microns. The glass substrate was mechanically tested to failure using ring-on-ring testing. The failure stress was determined to be approximately 615 MPa.

Example 1

Figure 9:
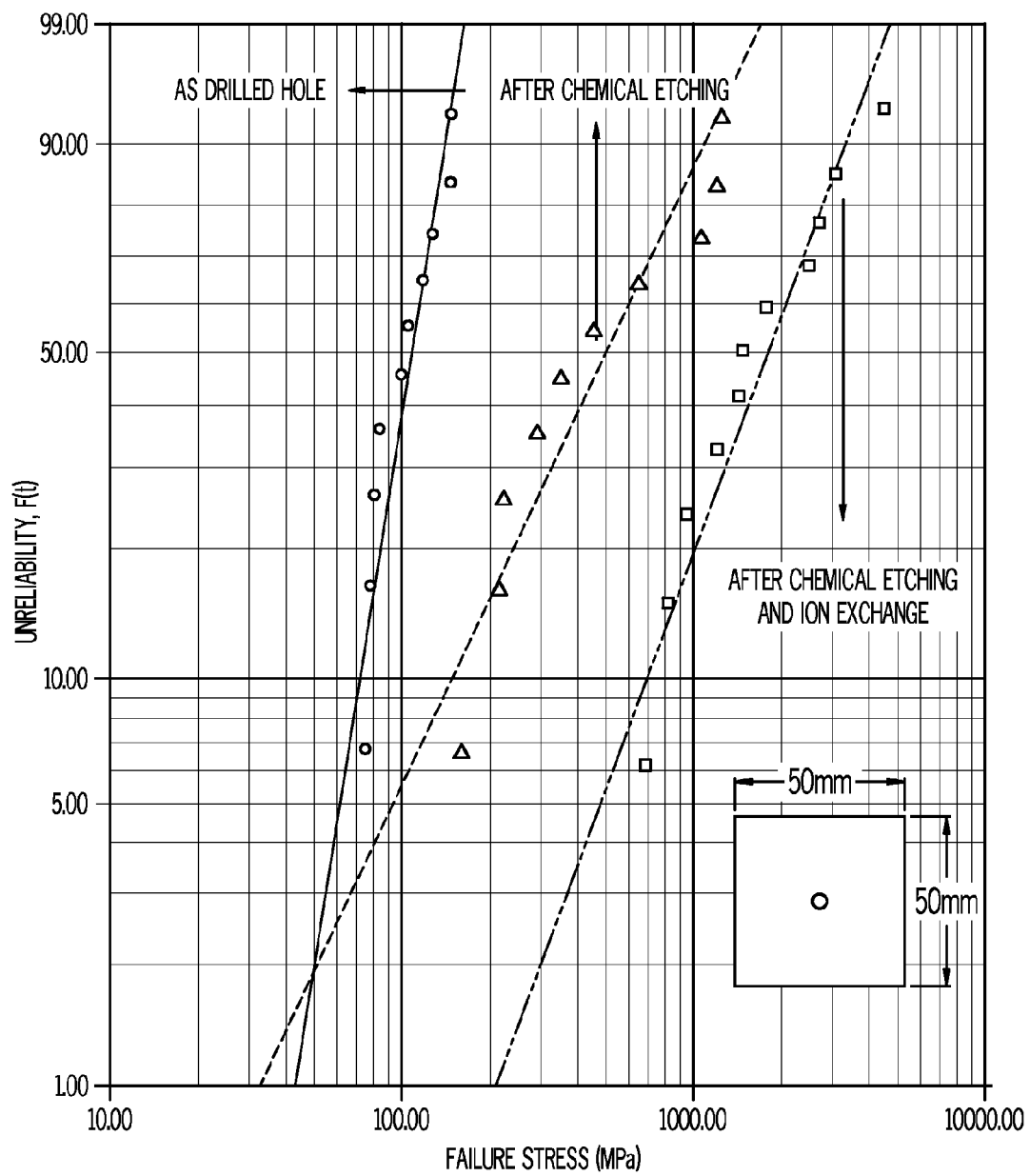
FIG. 9 graphically depicts a plot of the failure stress (x-axis) as a function of reliability (y-axis) of a glass substrate core with a single mechanically drilled through-via in i) as-drilled condition; ii) after chemical etching; and iii) after chemical etching followed by ion exchange strengthening.

Threes sets of 50 mm×50 mm glass interposer panels were formed from Gorilla™ alkali aluminosilicate glass. Each glass interposer panel had a thickness of 0.7 mm. In this example, a single through-via having a diameter of 1 mm was mechanically drilled at the center of each glass interposer panel, as indicated in FIG. 9. A first set of glass interposer panels were then mechanically tested to failure in as-drilled condition (i.e., without further processing) using ring-on-ring testing. The applied stress at failure (i.e., the failure stress) was recorded.

A second set of glass interposer panels were chemically etched in a solution of HF:HCl:20H$_2$O for 15 minutes to remove defects from the surfaces of the glass interposer panels and from the through-vias. Each of the glass interposer panels in the second set of glass interposer panels was then mechanically tested to failure using ring-on-ring testing. The applied stress at failure for each glass interposer panel was recorded.

A third set of glass interposer panels with single 1 mm diameter through-vias were chemically etched in a solution of HF:HCl:20H$_2$O for 15 minutes to remove defects from the surface of the glass interposer panels and from the through-vias. Thereafter, each of the glass interposer panels was ion exchange strengthened in molten KNO$_3$ at 410° C. for 7 hours. The resulting layer of compressive stress extended from each surface of the glass interposer panel to a depth of layer of approximately 50 microns. The ion exchange strengthening also formed an intermediate zone of compressive stress surrounding the sidewall of the through-via and extending from the sidewall of the through-via into the glass interposer panel such that the intermediate zone of compressive stress had a radial thickness of approximately 50 microns. The compressive stress of the first layer of compressive stress, the second layer of compressive stress, and the intermediate zone of compression was approximately 720 MPa. Thereafter, the third set of glass interposer panels were mechanically tested to failure using ring-on-ring testing. The failure stress of each glass interposer panel was recorded.

Referring now to FIG. 9, the strengths of the glass interposer panels of Example 1 are graphically illustrated in a Weibull plot of the failure stress (x-axis) and the reliability (y-axis). As shown in FIG. 9, the as-drilled glass interposer panels had an average failure stress of approximately 100 MPa thus indicating that the glass was significantly weakened after formation of the through-via relative to an un-drilled glass substrate. However, the average failure stress of the samples treated by chemical etching was approximately 400 MPa indicating a 4× strength improvement over the as-drilled, non-chemically etched glass interposer panels and also indicating that the chemical etching process restored the strength of the as-drilled interposer panel to approximately 90% of the strength of a comparable glass substrate without a through-via. Moreover, the average failure stress of samples treated by chemical etching followed by ion-exchange strengthening was approximately 2000 MPa indicating a 20× strength improvement over the as-drilled, non-chemically etched glass interposer panels and a 5× improvement over the as-drilled, chemically etched glass interposer panels.

Example 2

Figure 10:
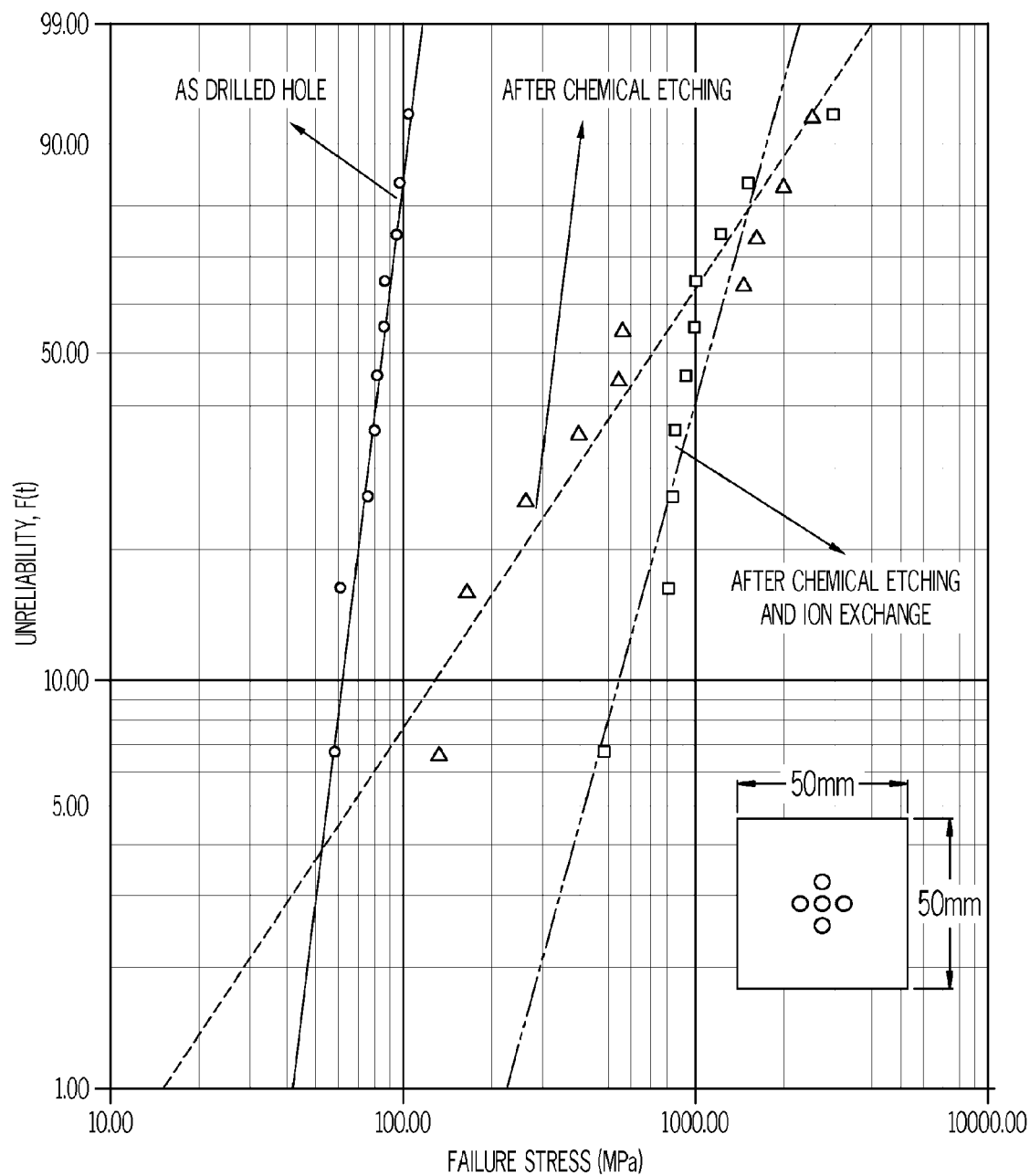
FIG. 10 graphically depicts a plot of the failure stress (x-axis) as a function of reliability (y-axis) of a glass substrate core with multiple mechanically drilled through-vias in i) as-drilled condition; ii) after chemical etching; and iii) after chemical etching followed by ion exchange strengthening.

Three sets of 50 mm×50 mm glass interposer panels were formed from Gorilla™ alkali aluminosilicate glass. Each glass interposer panel had a thickness of 0.7 mm. In this example, five through-vias were mechanically drilled in the glass interposer panel in a cross-configuration, as indicated in FIG. 10. Each through-via had a diameter of 1 mm and an edge-to-edge spacing of 300 microns. A first set of glass interposer panels was mechanically tested to failure in as-drilled condition (i.e., without further processing) using ring-on-ring testing. The applied stress at failure (i.e., the failure stress) was recorded.

A second set of glass interposer panels were chemically etched in a solution of HF:HCl:20H$_2$O for 15 minutes to remove defects from the surfaces of the glass interposer panels and from the through-vias, as described above. Each of the glass interposer panels in the second set of glass interposer panels was mechanically tested to failure using ring-on-ring testing. The applied stress at failure for each glass interposer panel was recorded.

A third set of glass interposer panels with 5 through-vias were chemically etched in a solution of HF:HCl:20H$_2$O for 15 minutes, as described above and, thereafter, each of the glass interposer panels was ion exchange strengthened in molten KNO$_3$ at 410° C. for 7 hours resulting in a compressive stress of approximately 720 MPa extending to a depth of layer of approximately 50 microns. The ion exchange strengthening formed an intermediate zone of compressive stress surrounding the sidewall of the through-vias and extending from the sidewalls of the through-vias into the glass interposer panel such that the intermediate zone of compressive stress had a radial thickness of approximately 50 microns. Thereafter, the third set of glass interposer panels were mechanically tested to failure using ring-on-ring testing. The failure stress of each glass interposer panel was recorded.

Referring now to FIG. 10, the strength of the glass interposer panels of Example 2 are graphically illustrated in a Weibull plot of the failure stress (x-axis) and the reliability (y-axis). As shown in FIG. 10, the as-drilled glass interposer panels had an average failure stress of less than 100 MPa thus indicating that the glass was significantly weakened after formation of the through-vias. However, the average failure stress of the samples treated by chemical etching was approximately 300 MPa, approximately 3× greater than the as-drilled, non-chemically etched glass interposer panels. Moreover, the average failure stress of samples treated by chemical etching followed by ion-exchange strengthening was approximately 1000 MPa indicating a 10× strength improvement over the as-drilled, non-chemically etched glass interposer panels.

Example 3

Threes sets of 50 mm×50 mm glass interposer panels were formed from Gorilla™ alkali aluminosilicate glass. Each glass interposer panel had a thickness of 0.7 mm. In this example, a single through-via having a diameter of 1 mm was laser drilled at the center of each glass interposer panel using a femtosecond laser trepanning technique. A first set of glass interposer panels were then mechanically tested to failure in as-drilled condition (i.e., without further processing) using ring-on-ring testing. The applied stress at failure (i.e., the failure stress) was recorded.

A second set of glass interposer panels were chemically etched in a solution of HF:HCl:20H$_2$O for 15 minutes to remove defects from the surfaces of the glass interposer panels and from the through-vias. Each of the glass interposer panels in the second set of glass interposer panels was then mechanically tested to failure using ring-on-ring testing. The applied stress at failure for each glass interposer panel was recorded.

A third set of glass interposer panels with single 1 mm diameter through-vias were chemically etched in a solution of HF:HCl:20H$_2$O for 15 minutes to remove defects from the surface of the glass interposer panels and from the through-vias. Thereafter, each of the glass interposer panels was ion exchange strengthened in molten KNO$_3$ at 410° C. for 7 hours. The resulting layer of compressive stress extended from each surface of the glass interposer panel to a depth of layer of approximately 50 microns. The ion exchange strengthening also formed an intermediate zone of compressive stress surrounding the sidewall of the through-via and extending from the sidewall of the through-via into the glass interposer panel such that the intermediate zone of compressive stress had a radial thickness of approximately 50 microns. The compressive stress of the first layer of compressive stress, the second layer of compressive stress, and the intermediate zone of compression was approximately 720 MPa. Thereafter, the third set of glass interposer panels were mechanically tested to failure using ring-on-ring testing. The failure stress of each glass interposer panel was recorded.

Figure 11:
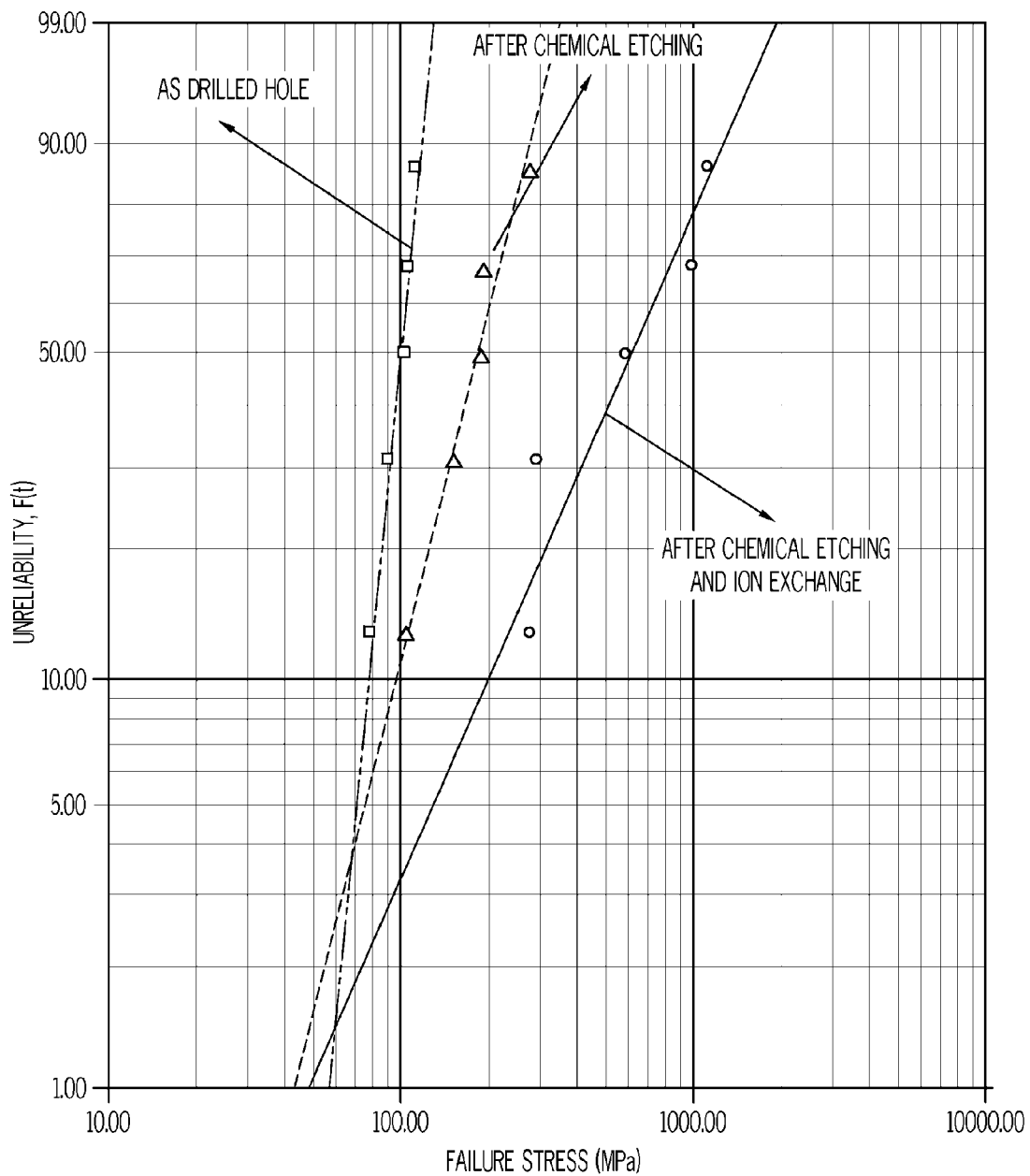
FIG. 11 graphically depicts a plot of the failure stress (x-axis) as a function of reliability (y-axis) of a glass substrate core with a single laser drilled through-via in i) as-drilled condition; ii) after chemical etching; and iii) after chemical etching followed by ion exchange strengthening.

Referring now to FIG. 11, the strengths of the glass interposer panels of Example 3 are graphically illustrated in a Weibull plot of the failure stress (x-axis) and the reliability (y-axis). As shown in FIG. 11, the strength of the interposer panels of Example 3 followed a similar trend as the interposer panels with mechanically drilled through-vias in Examples 1 and 2. Specifically, the strength of the interposer panels after chemical etching improved relative to the strength of the interposer panels in as-drilled condition. Further, the strength of the interposer panels after chemical etching and ion exchange strengthening improved relative to the strength of the interposer panels which were only chemically etched.

While Examples 1-3 describe glass interposer panels which are chemically etched prior to ion exchange strengthening, it should be understood that, in alternative embodiments, the glass interposer panels may be ion exchange strengthened without being chemically etched prior to ion exchange strengthening.

Based on the foregoing, it should be understood that the methods described herein may be used to form glass interposer panels with increased strength. Specifically, the glass interposer panels described herein are less susceptible to failure from cracks propagating from through-vias formed in the glass interposer panels and, as such, may be readily incorporated into three-dimensional electronic assemblies without an increased risk of failure due to cracking. Further, the thermal characteristics of the glass interposer panels described herein are compatible with materials commonly used in the manufacture of integrated circuits. Moreover, the glass interposer panels described herein are dimensionally stable over a broad range of operating temperatures.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method for making an interposer panel for an electronic assembly, the method comprising:
  forming a plurality of through-vias in a glass substrate core; and
  inducing a first layer of compressive stress, a second layer of compressive stress, and a plurality of intermediate zones of compressive stress in the glass substrate core, wherein:
    the first layer of compressive stress extends from a first surface of the glass substrate core into a thickness T of glass substrate core to a first depth of layer $D_1$;
    the second layer of compressive stress extends from a second surface of the glass substrate core into a thickness T of glass substrate core to a second depth of layer $D_2$ and is spaced apart from the first layer of compressive stress; and
    a sidewall of each through-via of the plurality of through-vias is surrounded by one of the plurality of intermediate zones of compressive stress, wherein each intermediate zone of compressive stress of the plurality of intermediate zones of compressive stress extends from the first layer of compressive stress to the second layer of compressive stress adjacent to the sidewall of each through-via.

2. The method of claim 1, wherein:
  the glass substrate core is ion-exchangeable; and
  the first layer of compressive stress, the second layer of compressive stress and the plurality of intermediate zones of compressive stress are induced by ion-exchange strengthening the glass substrate core.

3. The method of claim 1, further comprising etching the glass substrate core, wherein a strength of the glass substrate core after etching is greater than the strength of the glass substrate core before etching.

4. The method of claim 1, further comprising depositing a barrier layer on the first surface of the glass substrate core, the second surface of the glass substrate core, the sidewall of each through-via, or combinations thereof, wherein the barrier layer prevents diffusion of alkali ions from the glass substrate core.

5. The method of claim 1, further comprising metallizing the plurality of through-vias.

6. The method of claim 1, wherein the plurality of through-vias are formed in the glass substrate core by laser ablation, mechanical drilling, chemical etching, laser assisted processes, power blasting, water jet machining, electro-thermal focusing, or combinations thereof.

7. The method of claim 1, further comprising separating the glass substrate core after inducing the first layer of compressive stress, the second layer of compressive stress and the plurality of intermediate zones of compressive stress.

8. The method of claim 7, wherein the glass substrate core is separated along a parting line extending across at least one through-via.

9. A method for making an interposer panel for an electronic assembly, the method comprising:
  forming a plurality of through-vias in a glass substrate core comprising ion-exchangeable glass;
  etching the glass substrate core to remove flaws from the glass substrate core, wherein a strength of the glass substrate core is greater after etching than before etching; and
  strengthening the glass substrate core by ion exchange to:
    form a first layer of compressive stress extending from a first surface of the glass substrate core into a thickness T of the glass substrate core, wherein the first layer of compressive stress has a first depth of layer $D_1$;
    form a second layer of compressive stress extending from a second surface of the glass substrate core into the thickness T of the glass substrate core, wherein the second layer of compressive stress has a second depth of layer $D_2$ and is spaced apart from the first layer of compressive stress; and
    form a plurality of intermediate zones of compressive stress corresponding to the plurality of through-vias, wherein each through-via of the plurality of through-vias is surrounded by a corresponding one of the plurality of intermediate zones of compressive stress.

10. The method of claim 9, wherein each of the plurality of intermediate zones of compressive stress comprises a radial thickness R and extends from the first layer of compressive stress to the second layer of compressive stress adjacent to a sidewall of a corresponding through-via.

11. The method of claim 9, further comprising depositing a barrier layer on the first surface of the glass substrate core, the second surface of the glass substrate core, a sidewall of each through-via, or combinations thereof, wherein the barrier layer prevents diffusion of alkali ions from the glass substrate core.

12. The method of claim 9, further comprising depositing an adhesion layer on the glass substrate core, wherein the adhesion layer promotes the adhesion of additional materials subsequently applied to the glass substrate core.

* * * * *